(12) United States Patent
Huang

(10) Patent No.: US 10,277,226 B1
(45) Date of Patent: Apr. 30, 2019

(54) VOLTAGE TRANSLATOR DEVICE

(71) Applicant: SEMICONDUCTOR COMPONENTS INDUSTRIES, LLC, Phoenix, AZ (US)

(72) Inventor: Lei Huang, Sunnyvale, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 16/005,298

(22) Filed: Jun. 11, 2018

(51) Int. Cl.
  *H03K 19/0185* (2006.01)
  *H03K 17/22* (2006.01)
  *H03K 3/356* (2006.01)

(52) U.S. Cl.
  CPC ........... *H03K 19/018521* (2013.01); *H03K 3/356008* (2013.01); *H03K 3/356113* (2013.01); *H03K 17/223* (2013.01); *H03K 19/018571* (2013.01)

(58) Field of Classification Search
  None
  See application file for complete search history.

(56) References Cited

U.S. PATENT DOCUMENTS

| | | | |
|---|---|---|---|
| 5,696,728 A | 12/1997 | Yu et al. | |
| 6,600,679 B2 * | 7/2003 | Tanzawa | G11C 5/145 365/189.11 |
| 6,967,518 B2 | 11/2005 | Giacomini et al. | |
| 7,724,034 B2 * | 5/2010 | Tsu | H03K 17/6871 326/82 |
| 7,940,108 B1 * | 5/2011 | Wang | H03K 19/018528 326/62 |
| 8,149,017 B2 | 4/2012 | Knierim | |
| 9,197,200 B2 * | 11/2015 | Teplechuk | H03K 3/35613 |
| 2006/0066381 A1 | 3/2006 | Bhattacharya et al. | |
| 2006/0139086 A1 * | 6/2006 | Heinz | H03K 3/356113 327/333 |
| 2014/0152369 A1 | 6/2014 | Qi | |

* cited by examiner

*Primary Examiner* — Jeffery S Zweizig
(74) *Attorney, Agent, or Firm* — Brake Hughes Bellermann LLP

(57) ABSTRACT

In at least one general aspect, an apparatus can include a first voltage domain circuit configured to operate based on a first upper voltage and a first lower voltage, and a second voltage domain circuit configured to operate based on a second upper voltage and a second lower voltage. The apparatus can include a capacitive coupling circuit electrically connected between the first voltage domain circuit and the second voltage domain circuit, and a driver circuit including a switch device and electrically coupled to the second voltage domain circuit. The apparatus can also include an intermediate voltage domain circuit configured to trigger switching of the switch device included in the driver circuit where the intermediate voltage domain is configured to operate based on an intermediate voltage and the second upper voltage or the second lower voltage.

20 Claims, 6 Drawing Sheets

VOLTAGE TRANSLATOR DEVICE

TECHNICAL FIELD

This description relates to a voltage translator device.

BACKGROUND

Many applications have different power domains and need a translator to translate a signal from one power domain to another power domain. Some translators may not be capable of appropriately translating a signal from one power domain to another power domain when power supply voltages are relatively low. Thus, a need exists for systems, methods, and apparatus to address the shortfalls of present technology and to provide other new and innovative features.

SUMMARY

In at least one general aspect, an apparatus can include a first voltage domain circuit configured to operate based on a first upper voltage and a first lower voltage, and a second voltage domain circuit configured to operate based on a second upper voltage and a second lower voltage. The apparatus can include a capacitive coupling circuit electrically connected between the first voltage domain circuit and the second voltage domain circuit, and a driver circuit including a switch device and electrically coupled to the second voltage domain circuit. The apparatus can also include an intermediate voltage domain circuit configured to trigger switching of the switch device included in the driver circuit where the intermediate voltage domain is configured to operate based on an intermediate voltage and the second upper voltage or the second lower voltage.

The details of one or more implementations are set forth in the accompanying drawings and the description below. Other features will be apparent from the description and drawings, and from the claims.

DETAILED DESCRIPTION

A voltage translator device (e.g., a fast floating voltage translator), as described herein, can be configured to translate an input voltage signal from a first power domain (e.g., a high voltage domain) to a second power domain (e.g., a low voltage domain). An output voltage signal can be output based on voltages included in the second power domain. The voltage translator device includes an intermediate voltage domain circuit (also can be referred to as an intermediate stage) and capacitive coupling circuit (e.g., an alternating current (AC) coupling circuit) configured to facilitate translation of the input voltage signal to the output voltage signal. The capacitive coupling circuit can include one or more capacitors (e.g., metal-oxide-metal (mom) capacitors) for isolation of the first power domain from the second power domain. In some implementations, the voltage translator device can operate at relatively low voltage supplies (e.g., low power supply voltages within the voltage domains). In some implementations, the voltage translator device can have a relatively small propagation delay. In some implementations, the voltage translator device can be configured to use relatively low voltage devices (e.g., not high voltage devices) to reduce semiconductor die area. The voltage domains can be digital voltage domains with an upper voltage and a lower voltage.

Figure 1:
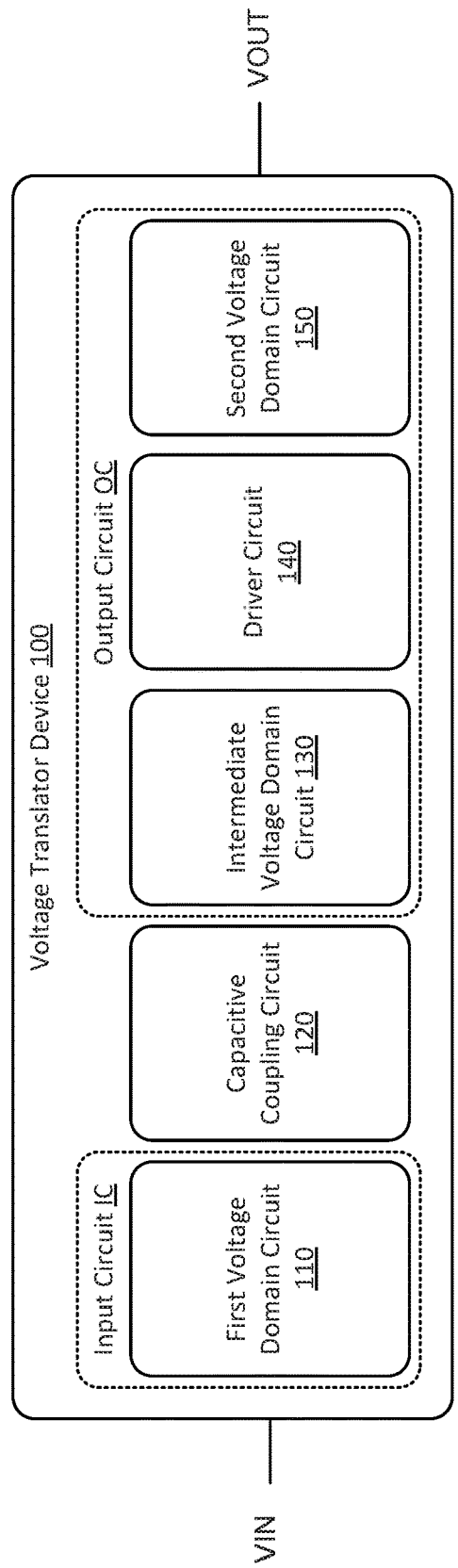
FIG. 1 is a diagram that illustrates a voltage translator device.

FIG. 1 is a diagram that illustrates a voltage translator device 100. The voltage translator device 100 is configured to translate an input voltage signal VIN (also can be referred to as an input signal) within a first voltage domain to an output voltage signal VOUT (also can be referred to as an output signal) within a second voltage domain. Each of the first voltage domain and the second voltage domain can include an upper voltage and a lower voltage that define a voltage range (e.g., a 3 V range, a 5 V range, a 10 V range). Accordingly, the input voltage signal can be configured to modulate (e.g., swing) within the voltage range (e.g., between a first upper voltage and a first lower voltage) defining the first voltage domain, and the output voltage signal can be configured to modulate (e.g., swing) within the voltage range (e.g., between a second upper voltage and a second lower voltage) defining the second voltage domain.

The first voltage domain can be associated with a first voltage domain circuit 110, and the second voltage domain can be associated with a second voltage domain circuit 150 shown in FIG. 1. Specifically, the first voltage domain circuit 110 can be configured to operate based on the first voltage domain, and the second voltage domain circuit 150 can be configured to operate based on the second voltage domain. The input signal VIN can be from a circuit (e.g., device) (not shown) coupled to (e.g., electrically coupled to) the voltage translator device 100 and operating within the first voltage domain. The output signal VOUT can be provided to (e.g., output to) a circuit and/or device (not shown) coupled to (e.g., electrically coupled to) the voltage translator device 100 and operating within the second voltage domain.

As shown in FIG. 1, the voltage translator device 100 includes a capacitive coupling circuit 120, an intermediate voltage domain circuit 130, and a driver circuit 140. The intermediate voltage domain circuit 130 can be configured to trigger a driver circuit 140 to drive (e.g., switch, set and reset) the second voltage domain circuit 150. The intermediate voltage domain circuit 130 can have an intermediate voltage domain that is different than the first voltage domain (associated with the first voltage domain circuit 110) and the second voltage domain (associated with the second voltage domain circuit 150).

The capacitive coupling circuit 120 is electrically connected between the first voltage domain and the second voltage domain. The capacitive coupling circuit 120 can be configured to isolate the first voltage domain from the second voltage domain. An input circuit IC can be including on a first side of the capacitive coupling circuit 120, and an output circuit OC can be included on the second side of the capacitive coupling circuit 120. The capacitive coupling circuit can be an alternating current (AC) coupling circuit.

In some implementations, the driver circuit 140 can include one or more switches. In some implementations, a switch included within the driver circuit 140 can be, or can include, a metal-oxide-semiconductor field-effect transistor (MOSFET) device (e.g., N-channel MOSFET (NMOS) device, P-channel MOSFET (PMOS) device), a bipolar junction transistor (BJT) device, and/or so forth.

In some implementations, the first voltage domain circuit 110 includes a latch circuit. In some implementations, the second voltage domain circuit 150 includes a latch circuit. In some implementations, the second voltage domain circuit 150 can include a latch circuit configured to be set and reset in response to the driver circuit 140. In some implementations, the second voltage domain circuit 150 can include a latch circuit configured to be set and reset in response to a switch device included in the driver circuit 140.

In some implementations, the output circuit OC can include a first latch circuit (within the second voltage domain circuit 150) configured to operate based on a second voltage domain different from the first voltage domain (of the input circuit IC). The output circuit OC can include a switch device (not shown) included within the driver circuit 140. The output circuit OC can include a second latch circuit (not shown) configured to trigger switching of the switch device and configured to operate based on an intermediate voltage domain of the intermediate voltage domain circuit 130.

In some implementations, a voltage range of the first voltage domain can overlap with a voltage range of the second voltage domain. For example, an upper voltage of the first voltage domain can be within the voltage range of the second voltage domain and/or a lower voltage of the first voltage domain can be within the voltage range of the second voltage domain. In some implementation, an upper voltage of the first voltage domain can be higher than an upper voltage of the second voltage domain and/or a lower voltage of the first voltage domain can be lower than a lower voltage of the second voltage domain.

In some implementations, a voltage range of the first voltage domain may not overlap with a voltage range of the second voltage domain. In other words, the voltage range of the first voltage domain can be outside of the voltage range of the second voltage domain.

In some implementations, a voltage range of the intermediate voltage domain can overlap with a voltage range of the first domain and/or a voltage range of the second voltage domain. For example, an upper voltage of the intermediate voltage domain can be within the voltage range of the first voltage domain and/or the voltage range of the second voltage domain. As another example, a lower voltage of the intermediate voltage domain can be within the voltage range of the first voltage domain and/or the voltage range of the second voltage domain.

In some implementations, at least a portion of a voltage range of the intermediate voltage domain can be outside of a voltage range of the first domain and/or a voltage range of the second voltage domain. For example, an upper voltage of the intermediate voltage domain can be outside of (e.g., above) the voltage range of the first voltage domain and/or the voltage range of the second voltage domain. As another example, a lower voltage of the intermediate voltage domain can be outside of (e.g., below) the voltage range of the first voltage domain and/or the voltage range of the second voltage domain.

In some implementations, the intermediate voltage domain circuit 130 can be configured to trigger switching of a switch device included in the driver circuit 140. The intermediate voltage domain circuit 130 can be configured to operate based on an intermediate voltage and the second upper voltage or the second lower voltage. For example, the intermediate voltage domain circuit 130 can be configured to operate based on an upper voltage of the intermediate voltage domain and a lower voltage of the intermediate voltage domain can be equal to a lower voltage of the second voltage domain of the second voltage domain circuit 150. As another example, the intermediate voltage domain circuit 130 can be configured to operate based on a lower voltage of the intermediate voltage domain and an upper voltage of the intermediate voltage domain can be equal to an upper voltage of the second voltage domain of the second voltage domain circuit 150.

In the implementations described herein, the voltage translator device 100 can operate based on voltages ranges that are relatively small (e.g., 1.8 V or lower). The voltage translator device 100 can have little to no static power dissipation. The propagation delay of voltage translator device 100 can be favorable given that the voltage translator device 100 includes capacitive coupling (e.g., capacitive coupling circuit 120). The voltage translator device 100 can include low-voltage devices (e.g., 30 V devices) (rather than high-voltage devices) with a relatively small size. The upper voltage of the first voltage domain circuit 110 can be greater than or less than upper voltage of the second voltage domain circuit 120.

Figure 2:
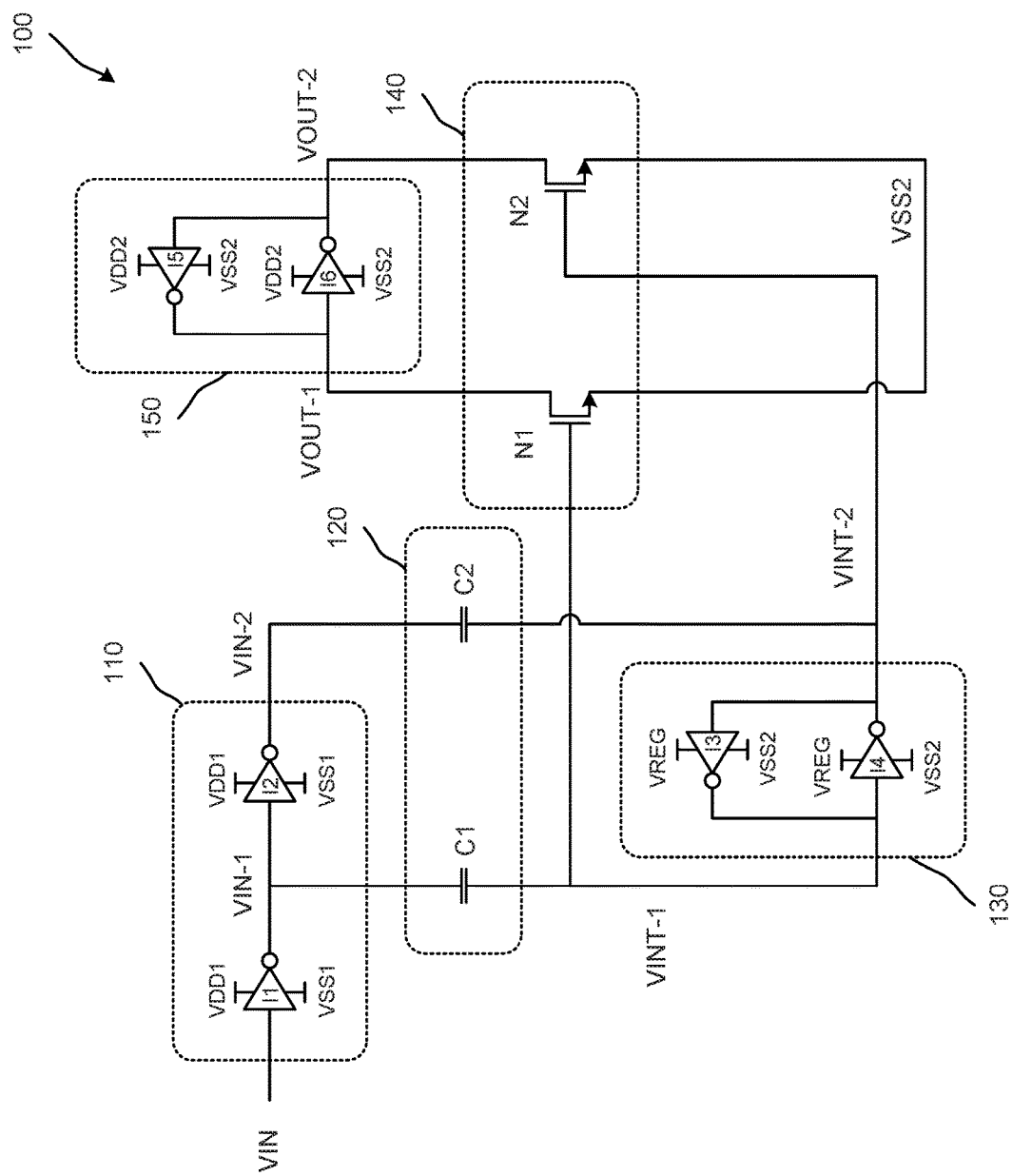
FIG. 2 is a diagram that illustrates an example implementation of the voltage translator device shown in FIG. 1.

FIG. 2 is a diagram that illustrates an example implementation of the voltage translator device 100 shown in FIG. 1. FIG. 2 illustrates examples of device elements that can be included in, or may function as, the first domain voltage circuit 110, the capacitive coupling circuit 120, the intermediate voltage domain circuit 130, the driver circuit 140, and/or the second voltage domain circuit 150.

As shown in FIG. 2, the first voltage domain circuit 110 operates based on a first voltage domain including first upper domain voltage VDD1 and first lower domain voltage VSS1. The second voltage domain circuit 150 operates based on a second voltage domain including second upper domain voltage VDD2 and second lower domain voltage VSS2. The intermediate voltage domain circuit 130 operates based on an intermediate voltage domain including an intermediate upper domain voltage VREG and the second lower domain voltage VSS2. Accordingly, the intermediate voltage domain circuit 130 and the second voltage domain circuit 150 have the same lower domain voltage (second lower domain voltage VSS2).

As shown in FIG. 2, the first voltage domain circuit 110 includes inverters I1 and I2. The input voltage VIN is inverted by the inverter I1 to VIN-1 and the voltage VIN-1 is inverted by the inverter I2 to VIN-2. The voltages VIN-1 and VIN-2 are within a voltage range defined by the first voltage domain of the first voltage domain circuit 110. The voltage VIN-1 is opposite the voltage VIN-2. For example, when the voltage of VIN-1 is high (e.g., at the upper voltage of the first voltage domain) the voltage of VIN-2 is low (e.g., at the lower voltage of the first voltage domain).

The voltage VIN-1 is capacitively coupled via capacitor C1 to the voltage VINT-1 and the voltage VIN-2 is capacitively coupled via capacitor C2 to voltage VINT-2. The voltages VINT-1 and VINT-2 are on opposite sides of the intermediate voltage domain circuit 130, which in this implementation, includes a latch circuit including inverters 13 and 14. The voltages VINT-1 and VINT-2 are within a voltage range defined by the intermediate voltage domain of the intermediate voltage domain circuit 110.

The voltage VINT-1 is opposite the voltage VINT-2. For example, when the voltage of VINT-1 is high (e.g., at the upper voltage of the intermediate voltage domain) the voltage of VINT-2 is low (e.g., at the lower voltage of the intermediate voltage domain).

The voltages VINT-1 and VINT-2 drive the elements of the driver circuit 140. Specifically, the voltage VINT-1 drives a gate of NMOS device N1 via a connection between the intermediate voltage domain circuit 130 (e.g., an input side of the intermediate voltage domain circuit 130) and the gate of NMOS device N1. The voltage VINT-2 drives a gate of NMOS device N2 via a connection between the intermediate voltage domain circuit 130 (e.g., an input side of the intermediate voltage domain circuit 130) and the gate of NMOS device N2.

As shown in FIG. 2, a source of the NMOS device N1 of the driver circuit 140 is coupled to a source of the NMOS device N2 of the driver circuit 140. The drain of the NMOS device N1 is connected (e.g., via an electrical connection) to an input side of the second voltage domain circuit 150. The drain of the NMOS device N2 is connected (e.g., via an electrical connection) to an output side of the second voltage domain circuit 150. Accordingly, the driver circuit 140 is connected to the input side and the output side of the second voltage domain circuit 150.

The voltage VOUT-1 can function as the output signal of the voltage translator device 100. The voltage VOUT-1 can be at the same state as the input voltage VIN, but the two voltages can be in different voltage domains. For example, when the voltage VIN is at a high voltage (e.g., high state) of the first voltage domain, the voltage VOUT-1 is at the high voltage (e.g., high state) of the second voltage domain.

The voltage VOUT-2 can be opposite the voltage VOUT-1. For example, when the voltage of VOUT-1 is high (e.g., at the upper voltage of the second voltage domain) the voltage of VOUT-2 is low (e.g., at the lower voltage of the second voltage domain). The voltages VOUT-1 and VOUT-2 are on opposite sides of the second voltage domain circuit 150. The voltages VOUT-1 and VOUT-2 are within a voltage range defined by the second voltage domain of the second voltage domain circuit 150.

In this implementation, the second voltage domain circuit 150 includes a latch circuit including inverters 15 and 16. The latch circuit of the second voltage domain circuit 150 can be configured to be set and reset in response to the NMOS devices N1, N2 included in the driver circuit 140 (even with relatively low power supply voltages).

An example of operation of the voltage translator circuit 100 shown in FIG. 2 is as follows. When the voltage VIN is high, the voltage VIN-1 is low (in the first voltage domain as voltage VSS1) and the voltage VIN-2 is high (in the first voltage domain as voltage VDD1). The voltages VIN-1 and VIN-2 are capacitively coupled via the capacitive coupling circuit to voltages VINT-1 and VINT-2, which are low (i.e., voltage VSS2) and high (i.e., voltage VREG), respectively, in the intermediate voltage domain. Voltage VINT-1, which is equal to voltage VSS2, turns off (to an OFF state) NMOS device N1 so that VOUT-1 is high (in the second voltage domain as voltage VDD2) and VINT-2, which is equal to voltage VREG, turns on (to an ON state) NMOS device N2 so that VOUT-2 is low (in the second voltage domain as voltage VSS2).

Figure 3:
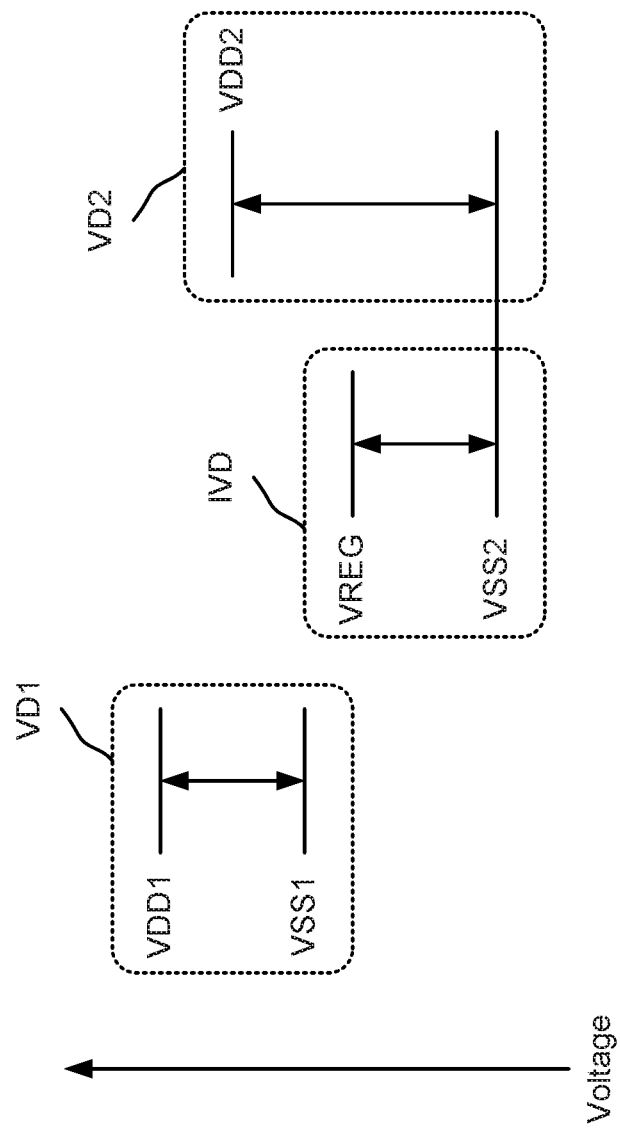
FIG. 3 is a diagram that illustrates example voltage domains associated with the voltage translator devices shown in FIGS. 1 and 2.

FIG. 3 is a diagram that illustrates example voltage domains associated with the voltage translator devices 100 shown in FIGS. 1 and 2. As shown in FIG. 3, the first voltage domain VD1 has a voltage range including upper voltage VDD1 and lower voltage VSS1, the intermediate voltage domain IVD has a voltage range including upper voltage VREG and lower voltage VSS2, and the second voltage domain VD2 has a voltage range including upper voltage VDD2 and lower voltage VSS2. Because the circuit shown in FIG. 2 includes NMOS devices N1, N2, the intermediate voltage domain IVD is based on the upper voltage VREG and lower voltage VSS2 (from the second voltage domain VD2).

As shown in FIG. 3, the first voltage domain VD1 has a voltage range different from a voltage range of the second voltage domain VD2. The intermediate voltage domain IVD has a voltage range that overlaps with at least the voltage range of the second voltage domain VD2. In some implementations, the intermediate voltage domain IVD can have a voltage range that overlaps with the voltage range of the first voltage domain VD1 (and/or the voltage range of the second voltage domain VD2).

As shown in FIG. 3, the intermediate voltage VREG is less than the upper voltage VDD2 of the second voltage domain VD2. The intermediate voltage VREG is between the upper voltage VDD2 and lower voltage VSS2 of the second voltage domain VD2. The intermediate voltage VREG is between the upper voltage VDD1 and lower voltage VSS1 of the first voltage domain VD1. In some implementations, a difference (e.g., an absolute difference) between the intermediate voltage VREG and the upper voltage VDD2 is at least two times greater (e.g., 1.6 V) than a threshold voltage (e.g., 0.8 V) of a switch device (e.g., NMOS device N1 and/or NMOS device N2) included in the driver circuit 140 shown in FIG. 2. The voltage VREG in the intermediate voltage domain circuit 130 is high enough so that the NMOS devices N1, N2 can set and reset the latch circuit included in the second voltage domain circuit 150 (even with relatively low power supply voltages).

Figure 4:
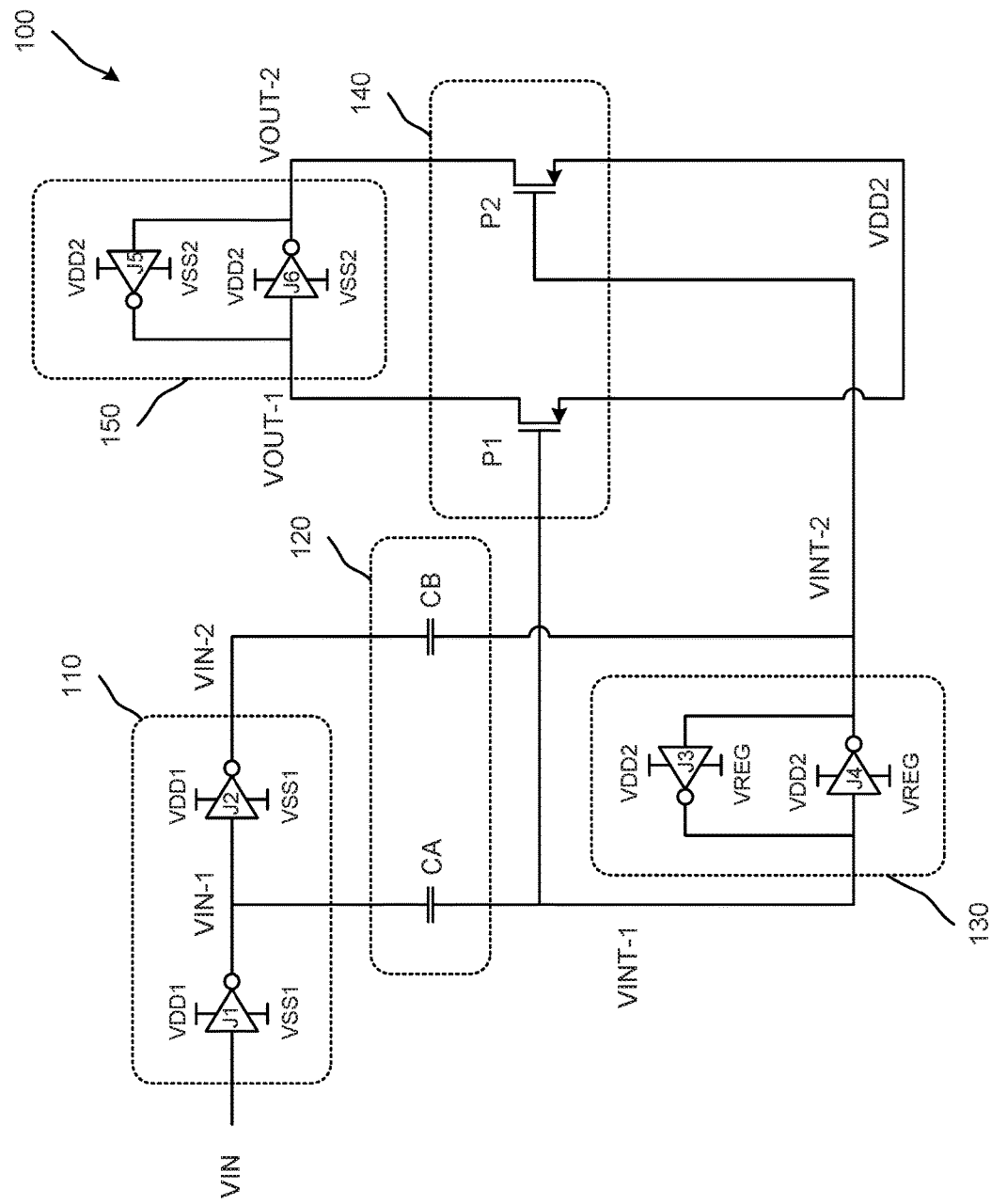
FIG. 4 is a diagram that illustrates an example implementation of the voltage translator device shown in FIG. 1.

FIG. 4 is a diagram that illustrates an example implementation of the voltage translator device 100 shown in FIG. 1. FIG. 4 illustrates examples of device elements that can be included in, or may function as, the first domain voltage circuit 110, the capacitive coupling circuit 120, the intermediate voltage domain circuit 130, the driver circuit 140, and/or the second voltage domain circuit 150. Many of the elements shown in FIG. 4 that are similar or the same as those in FIG. 2 will not be described again in connection with FIG. 4 to simplify the description.

As shown in FIG. 4, the intermediate voltage domain circuit 130 operates based on an intermediate voltage domain including upper domain voltage VDD2 and intermediate lower domain voltage VREG. Accordingly, the intermediate voltage domain circuit 130 and the second voltage domain circuit 150 have the same upper domain voltage (second upper domain voltage VDD2).

As shown in FIG. 4, the first voltage domain circuit 110 includes inverters J1 and J2. The voltage VIN-1 is capacitively coupled via capacitor CA to the voltage VINT-1 and the voltage VIN-2 is capacitively coupled via capacitor CB to voltage VINT-2. In this implementation, the intermediate voltage domain circuit 130 includes a latch circuit including inverters J3 and H4. The voltages VINT-1 and VINT-2 are within a voltage range defined by the intermediate voltage domain of the intermediate voltage domain circuit 110.

The voltages VINT-1 and VINT-2 drive the elements of the driver circuit. Specifically, the voltage VINT-1 drives a gate of PMOS device P1 via a connection between the intermediate voltage domain circuit 130 (e.g., an input side of the intermediate voltage domain circuit 130) and the gate of PMOS device P1. The voltage VINT-2 drives a gate of PMOS device P2 via a connection between the intermediate voltage domain circuit 130 (e.g., an input side of the intermediate voltage domain circuit 130) and the gate of PMOS device P2.

As shown in FIG. 4, a source of the PMOS device P1 of the driver circuit 140 is coupled to a source of the PMOS device P2 of the driver circuit 140. The drain of the PMOS device P1 is connected (e.g., via an electrical connection) to an input side of the second voltage domain circuit 150. The drain of the PMOS device P2 is connected (e.g., via an electrical connection) to an output side of the second voltage domain circuit 150. Accordingly, the driver circuit 140 is connected to the input side and the output side of the second voltage domain circuit 150.

The voltage VOUT-1 can function as the output signal of the voltage translator device 100. The voltage VOUT-1 can be at the same state as the input voltage VIN, but the two voltages can be in different voltage domains. The voltage VOUT-2 can be opposite the voltage VOUT-1, and the voltages VOUT-1 and VOUT-2 are within a voltage range defined by the second voltage domain of the second voltage domain circuit 150.

In this implementation, the second voltage domain circuit 150 includes a latch circuit including inverters J5 and J6. The latch circuit of the second voltage domain circuit 150 can be configured to be set and reset in response to the PMOS devices P1, P2 included in the driver circuit 140 (even with relatively low power supply voltages).

An example of operation of the voltage translator circuit 100 shown in FIG. 4 is as follows. When the voltage VIN is high, the voltage VIN-1 is low (in the first voltage domain as voltage VSS1) and the voltage VIN-2 is high (in the first voltage domain as voltage VSS1). The voltages VIN-1 and VIN-2 are capacitively coupled via the capacitive coupling circuit to voltages VINT-1 and VINT-2, which are low (i.e., voltage VREG (e.g., a ground voltage)) and high (i.e., voltage VDD2), respectively, in the intermediate voltage domain. Voltage VINT-1, which is equal to voltage VREG, turns on PMOS device P1 so that VOUT-1 is high (in the second voltage domain as voltage VDD2) and VINT-2, which is voltage VDD2, turns off PMOS device P2 so that VOUT-2 is low (in the second voltage domain as voltage VSS2).

Figure 5:
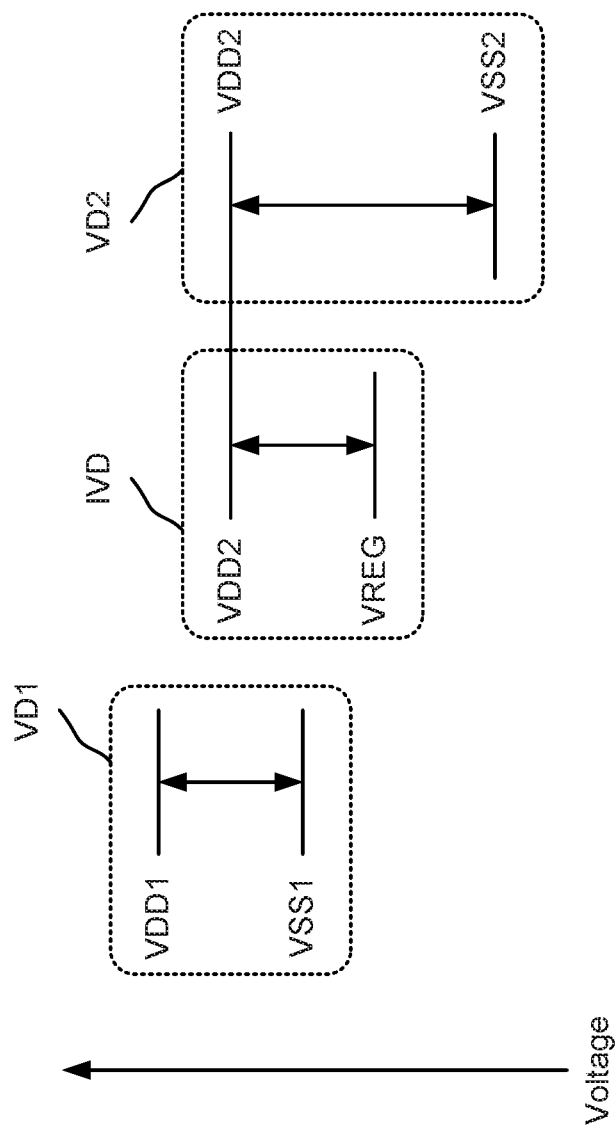
FIG. 5 is a diagram that illustrates example voltage domains associated with the voltage translator devices shown in FIGS. 1 and 4.

FIG. 5 is a diagram that illustrates example voltage domains associated with the voltage translator devices 100 shown in FIGS. 1 and 4. As shown in FIG. 5, the first voltage domain VD1 has a voltage range including upper voltage VDD1 and lower voltage VSS1, the intermediate voltage domain IVD has a voltage range including upper voltage VDD2 and lower voltage VREG, and the second voltage domain VD2 has a voltage range including upper voltage VDD2 and lower voltage VSS2. Because the circuit shown in FIG. 4 includes PMOS devices P1, P2, the intermediate voltage domain IVD is based on the upper voltage VDD2 (from the second voltage domain VD2) and lower voltage VREG.

As shown in FIG. 5, the first voltage domain VD1 has a voltage range different from a voltage range of the second voltage domain VD2. The intermediate voltage domain IVD has a voltage range that overlaps with the voltage range of the first voltage domain VD1 and the voltage range of the second voltage domain VD2. In some implementations, the intermediate voltage domain IVD can have a voltage range that does not overlap with the voltage range of the first voltage domain VD1 (and/or the voltage range of the second voltage domain VD2).

As shown in FIG. 5, the intermediate voltage VREG is less than the upper voltage VDD2 of the second voltage domain VD2. The intermediate voltage VREG is between the upper voltage VDD2 and lower voltage VSS2 of the second voltage domain VD2. The intermediate voltage VREG is outside of the upper voltage VDD1 and lower voltage VSS1 of the first voltage domain VD1. In some implementations, a difference (e.g., an absolute difference) between the intermediate voltage VREG and the upper voltage VDD2 is at least two times greater (e.g., 1.6 V) than a threshold voltage (e.g., 0.8 V) of a switch device (e.g., PMOS device P1 and/or PMOS device P2) included in the driver circuit 140 shown in FIG. 4. The voltage VREG included in the intermediate voltage domain circuit 130 is low enough so that the PMOS devices P1, P2 can set and reset the latch circuit included in the second voltage domain circuit 150 (even with relatively low power supply voltages).

The intermediate voltage domain circuit 110 (shown in FIGS. 1-5) can enable proper operation of the second voltage domain circuit 150 (e.g., the latch in the second voltage domain circuit 150). The intermediate voltage domain circuit 110 can enable proper operation of the second voltage domain circuit 150 (e.g., the latch in the second voltage domain circuit 150) even when the second voltage domain is relatively low. During voltage transitions of the voltage VIN, the voltage swing of capacitors C1, C2 can be different. Despite this difference in voltage swing, the voltage translator device 100 can function at relatively high frequencies. The voltage translator device 100 (because of the intermediate voltage domain circuit 110) can operate even when the voltage range of the second voltage domain is relatively small (when translating from a high voltage domain to a low voltage domain). The voltage translator device (because of the intermediate voltage domain circuit 110) can operate even when the voltage range of the first voltage domain is relatively small (when translating from a low voltage domain to a high voltage domain).

Figure 6:
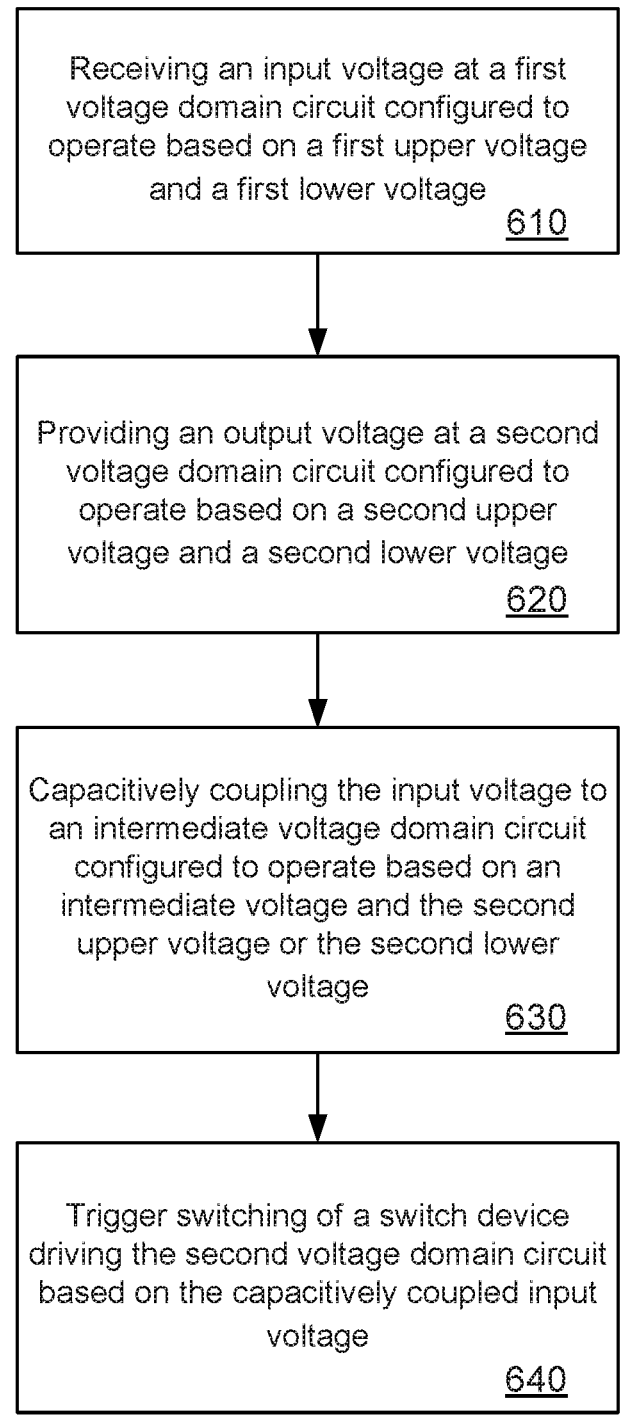
FIG. 6 is a flowchart that illustrates a method of operating the voltage translator devices described herein.

FIG. 6 is a flowchart that illustrates a method of operating the voltage translator devices (e.g., voltage translator device 100) described herein. As shown in FIG. 6, the method includes receiving an input voltage at a first voltage domain circuit configured to operate based on a first upper voltage and a first lower voltage (block 610). The first voltage domain can be, for example, the first voltage domain circuit 110 shown in FIG. 1. The second voltage domain circuit 150 can include a latch circuit.

The method includes providing an output voltage at a second voltage domain circuit configured to operate based on a second upper voltage and a second lower voltage (block 620). The second voltage domain can be, for example, the second voltage domain circuit 150 shown in FIG. 1. The second voltage domain circuit 150 can include a latch circuit.

The method includes capacitively coupling the input voltage to an intermediate voltage domain circuit configured to operate based on an intermediate voltage and the second upper voltage or the second lower voltage (block 630). The capacitive coupling can be performed using the capacitive coupling circuit 120 shown in FIG. 1. The voltage domains can correspond with those shown in, for example, FIGS. 3 and 5.

The method includes triggering of switching of a switch device driving the second voltage domain circuit based on the capacitively coupled input voltage (block 640). The switch device can be included in, for example, the driver circuit 140 shown in FIG. 1.

In the foregoing description, when an element, such as a layer, a region, a substrate, or component is referred to as being on, connected to (e.g., via a connection), electrically connected to (e.g., via a connection), coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus, comprising:
   a first voltage domain circuit configured to operate based on a first upper voltage and a first lower voltage;
   a second voltage domain circuit configured to operate based on a second upper voltage and a second lower voltage;
   a capacitive coupling circuit electrically connected between the first voltage domain circuit and the second voltage domain circuit;
   a driver circuit including a switch device and electrically coupled to the second voltage domain circuit; and
   an intermediate voltage domain circuit configured to trigger switching of the switch device included in the driver circuit, the intermediate voltage domain circuit configured to operate based on an intermediate voltage and the second upper voltage or the second lower voltage.

2. The apparatus of claim 1, wherein the intermediate voltage is less than the second upper voltage.

3. The apparatus of claim 1, wherein the intermediate voltage is greater than the second lower voltage.

4. The apparatus of claim 1, wherein a difference between the intermediate voltage and the second upper voltage or the second lower voltage is at least two times greater than a threshold voltage of the switch device included in the driver circuit.

5. The apparatus of claim 1, wherein the switch device is an N-channel device when the intermediate voltage domain operates based on the intermediate voltage and the second lower voltage.

6. The apparatus of claim 1, wherein the switch device is a P-channel device when the intermediate voltage domain operates based on the intermediate voltage and the second upper voltage.

7. The apparatus of claim 1, wherein the first voltage domain circuit includes a latch circuit.

8. The apparatus of claim 1, wherein the second voltage domain circuit includes a latch circuit configured to be set and reset in response to the switch device.

9. An apparatus, comprising:
   a capacitive coupling circuit
   an input circuit electrically coupled on a first side of the capacitive coupling circuit and configured to operate based on a first voltage domain; and
   an output circuit on a second side of the capacitive coupling circuit,
   the output circuit including:
      a first latch circuit configured to operate based on a second voltage domain different from the first voltage domain,
      a switch device, and
      a second latch circuit configured to trigger switching of the switch device and configured to operate based on an intermediate voltage domain.

10. The apparatus of claim 9, wherein the intermediate voltage domain has a voltage range that overlaps with a voltage range of the second voltage domain.

11. The apparatus of claim 9, wherein the intermediate voltage domain has an upper voltage that is equal to an upper voltage of the second voltage domain.

12. The apparatus of claim 9, wherein the intermediate voltage domain has a lower voltage that is equal to a lower voltage of the second voltage domain.

13. The apparatus of claim 9, wherein the intermediate voltage domain has a voltage range at least two times greater than a threshold voltage of the switch device.

14. The apparatus of claim 9, wherein the first latch circuit is configured to be set and reset by the switch device.

15. The apparatus of claim 9, wherein the first voltage domain has a voltage range different from a voltage range of the second voltage domain.

16. A method, comprising:
   receiving an input voltage at a first voltage domain circuit configured to operate based on a first upper voltage and a first lower voltage;
   providing an output voltage at a second voltage domain circuit configured to operate based on a second upper voltage and a second lower voltage;
   capacitively coupling the input voltage to an intermediate voltage domain circuit configured to operate based on an intermediate voltage and the second upper voltage or the second lower voltage; and trigger switching of a switch device driving the second voltage domain circuit based on the capacitively coupled input voltage.

17. The method of claim 16, wherein the first voltage domain has a voltage range different from a voltage range of the second voltage domain.

18. The method of claim 16, wherein the second voltage domain circuit includes a latch circuit configured to be set and reset in response to the switch device.

19. The method of claim 16, wherein a difference between the intermediate voltage and the second upper voltage or the second lower voltage is at least two times greater than a threshold voltage of the switch device.

20. The method of claim 16, wherein the intermediate voltage is between the second upper voltage and the second lower voltage.

* * * * *